(12) United States Patent
Benjamin et al.

(10) Patent No.: US 11,205,024 B2
(45) Date of Patent: Dec. 21, 2021

(54) TECHNIQUES FOR MEASURING PRODUCTIVE CONGESTION WITHIN AN ARCHITECTURAL SPACE

(71) Applicant: AUTODESK, INC., San Rafael, CA (US)

(72) Inventors: David Benjamin, New York, NY (US); Danil Nagy, New York, NY (US); Lorenzo Villaggi, New York, NY (US)

(73) Assignee: AUTODESK, INC., San Rafael, CA (US)

( * ) Notice: Subject to any disclaimer, the term of this patent is extended or adjusted under 35 U.S.C. 154(b) by 396 days.

(21) Appl. No.: 15/908,370

(22) Filed: Feb. 28, 2018

(65) Prior Publication Data

US 2018/0253511 A1   Sep. 6, 2018

Related U.S. Application Data

(60) Provisional application No. 62/465,749, filed on Mar. 1, 2017.

(51) Int. Cl.
*G06F 30/13* (2020.01)
*G06Q 10/06* (2012.01)
*G06F 30/18* (2020.01)

(52) U.S. Cl.
CPC .............. *G06F 30/13* (2020.01); *G06F 30/18* (2020.01); *G06Q 10/063* (2013.01)

(58) Field of Classification Search
CPC ........ G06F 30/13; G06F 30/18; G06Q 10/063
USPC ............................................................. 703/1
See application file for complete search history.

(56) References Cited

U.S. PATENT DOCUMENTS

| | | | | |
|---|---|---|---|---|
| 9,619,586 | B2 * | 4/2017 | Bhaskara | G06F 30/00 |
| 10,026,014 | B2 * | 7/2018 | Krutsch | G06K 9/6219 |
| 2005/0002570 | A1 * | 1/2005 | Clark | G06K 9/4609 |
| | | | | 382/199 |
| 2013/0112407 | A1 * | 5/2013 | Cheng | E21B 43/12 |
| | | | | 166/250.15 |
| 2013/0346036 | A1 * | 12/2013 | Borjesson | G06F 30/00 |
| | | | | 703/2 |
| 2015/0339412 | A1 * | 11/2015 | Vitaletti | G06F 17/10 |
| | | | | 703/1 |
| 2016/0188767 | A1 * | 6/2016 | Razin | G06F 30/18 |
| | | | | 703/13 |

OTHER PUBLICATIONS

Subhajit Das et al., Space Plan Generator, Conference: Acadia 2016, Oct. 2016, pp. 106-115 (Year: 2016).*

(Continued)

*Primary Examiner* — Justin C Mikowski
(74) *Attorney, Agent, or Firm* — Artegis Law Group, LLP (57) ABSTRACT

One embodiment of the present invention sets forth a technique for evaluating productive congestion within an architectural space design. The technique includes generating a space analysis graph for the architectural space design. The technique further includes determining a traversal value for at least a first node of a plurality of nodes included in the space analysis graph, determining a centroid of the plurality of nodes, determining a path within the space analysis graph from at least the first node to the centroid, and determining a productive congestion metric based on at least the path from the first node to the centroid and the traversal value of the first node.

20 Claims, 8 Drawing Sheets

(56) References Cited

OTHER PUBLICATIONS

Davide Schaumann et al., A computational framework to simulate human spatial behavior in built environments, SimAUD May 16-18, 2016 London, UK, 2016 Society for Modeling & Simulation International (SCS), pp. 121-128 (Year: 2016).*
Aschwanden et al., "Empiric Design Evaluation in Urban Planning", Automation in Construction, vol. 20, No. 3, May 2011, pp. 299-310.
Comptdaer et al., "Multi-Scale Behavioral Models for Urban Crisis Training Simulation", Proceedings of BRIMS, 16th conference on behavior representation in modeling and simulation, Norfolk, Mar. 2007, 9 pages.
Drettakis et al., "Design and Evaluation of a Real-World Virtual Environment for Architecture and Urban Planning", May 8, 2006, pp. 1-22.
Feng et al., "Crowd-Driven Mid-Scale Layout Design", ACM Transactions on Graphics, vol. 35, No. 4, Jul. 2016, 14 pages.
Gwynne et al., "A Review of the Methodologies used in the Computer Simulation of Evacuation from the Built Environment", Building and environment, vol. 34, No. 6, 1999, pp. 741-749.
Li et al., "Embedding Sustainable Development Strategies in Agent-Based Models for use as a Planning Tool", International Journal of Geographical Information Science, vol. 22, No. 1, Mar. 5, 2008, pp. 21-45.
Lindsay, Greg, "Engineering Serendipity", URL : http://www.nytimes.com/2013/04/07/opinion/sunday/engineeringserendipity.html, New York Times, Apr. 5, 2013, 2 pages.
Penn et al., "Space Syntax Based Agent Simulation", 2001, pp. 99-114.
Silverman, Rachel Emma, "The Science of Serendipity in the Workplace", URL : https://www.wsj.com/articles/SB10001424127887323798104578455081218505870, Wall Street Journal, Apr. 30, 2013, 1 page.
Lee et al., "On Applying Viewshed Analysis for Determining Least-Cost Paths on Digital Elevation Models", International Journal of Geographical Information Science, vol. 12, No. 8, 1998, pp. 891-905.
Turner et al., "From isovists to visibility graphs: a methodology for the analysis of architectural space", Environment and Planning B: Planning and Design, vol. 28, 2001, pp. 103-121.
Turner et al., "An Algorithmic Definition of the Axial Map", Environment and Planning B: planning and design, vol. 32, No. 3, 2005, pp. 425-444.
Waber et al., "Workspaces That Move People", URL : https://hbr.org/2014/10/workspaces-that-move-people, Harvard Business Review, Oct. 2014, 10 pages.
Nagy et al. "Project Discover: An application of generative design for architectural space planning." Proceedings of the Symposium on Simulation for Architecture and Urban Design. Society for Computer Simulation International, 2017, 8 pages.

* cited by examiner

TECHNIQUES FOR MEASURING PRODUCTIVE CONGESTION WITHIN AN ARCHITECTURAL SPACE

CROSS-REFERENCE TO RELATED APPLICATIONS

This application claims priority benefit of the United States Provisional Patent Application titled, "TECHNIQUES FOR MEASURING PRODUCTIVE CONGESTION WITHIN AN ARCHITECTURAL SPACE," filed on Mar. 1, 2017 and having Ser. No. 62/465,749. The subject matter of this related application is hereby incorporated herein by reference.

BACKGROUND

Field of the Various Embodiments

Embodiments of the present invention relate generally to computer-aided design, and more particularly, to techniques for measuring productive congestion within an architectural space.

Description of the Related Art

One technique for designing architectural spaces is the generative design method. The generative design method uses metaheuristic search techniques to calculate and evaluate numerous design options, and discover the design options that achieve defined design objectives. This method, which is normally automated, allows a designer to explore substantially more design options than would be possible through manual methods.

When designing architectural spaces and layouts associated with such spaces, a quality that is of concern to designers is the congestion quality of a space. Typically, designers are concerned with the negative congestion quality of a space (e.g., congestion that causes bottlenecks during an emergency evacuation). There is, however, also a positive congestion quality of a space, also called "productive congestion" or "buzz," that a designer may consider when designing a space. Productive congestion reflects crowding or congestion that has positive effects, such as increased social and professional interactions, serendipitous encounters, increased traffic to desired areas, and increased exchange of ideas.

One conventional technique for analyzing the congestion of an architectural space is crowd simulation. Crowd simulation involves simulating the congestion of a space using dynamic agents. One drawback of the crowd simulation technique is that crowd simulation is computationally expensive and time-consuming. The tracking of many dynamic agents in the simulations expends much computational time and resources. For example, a crowd simulation for one design option may take several hours. In generative design methods that involve evaluating numerous design options that may number in the thousands or even more, the excessive time and resource expense of the crowd simulations makes the crowd simulation technique impractical for use in generative design.

Another conventional technique for analyzing the congestion of an architectural space is space syntax. The space syntax technique is a collection of methods for applying static computations to analyze the physical topology and morphology of a given architectural space. One drawback of the space syntax technique is that the technique is based on analyzing the physical morphology and topology of a space, and thus does not yield a defined, quantified metric of congestion that actually accounts for occupant-level behaviors. Without a well-defined metric for congestion, comparing different design options for congestion optimization within the generative design method becomes difficult if not impossible.

As the foregoing illustrates, what is needed are more effective techniques for evaluating the productive congestion of a design for an architectural space.

SUMMARY

One embodiment of the present invention sets forth a method for evaluating productive congestion within an architectural space design. The method includes generating a space analysis graph for the architectural space design. The method further includes determining a traversal value for at least a first node of a plurality of nodes included in the space analysis graph, determining a centroid of the plurality of nodes, determining a path within the space analysis graph from at least the first node to the centroid, and determining a productive congestion metric based on at least the path from the first node to the centroid and the traversal value of the first node.

Further embodiments provide, among other things, a system and a non-transitory computer-readable medium configured to implement the method set forth above.

At least one advantage and technological improvement of the disclosed techniques is that the productive congestion of a space is measured in a computationally inexpensive and less time-consuming manner relative to conventional techniques. As a result, the productive congestion of multiple space designs may be measured relatively quickly, making the optimization of productive congestion in designs within generative design methods practical.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

Figure 1:
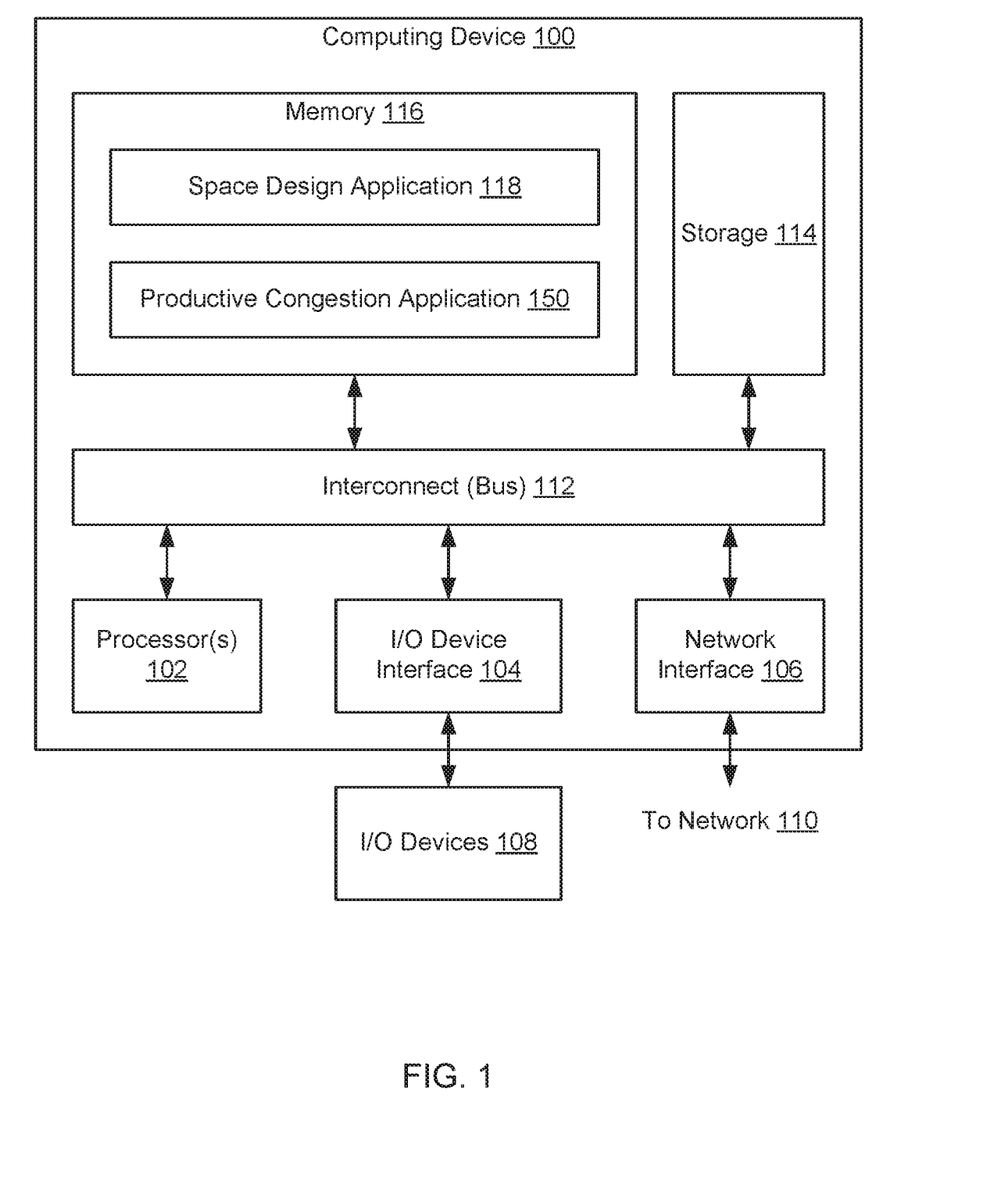
FIG. 1 illustrates a computing device configured to implement one or more aspects of the present invention.

FIG. 1 illustrates a computing device 100 configured to implement one or more aspects of the present invention. Computing device 100 may be a desktop computer, a laptop computer, a smart phone, a personal digital assistant (PDA), tablet computer, or any other type of computing device configured to receive input, process data, and optionally display images and/or graphics, and is suitable for practicing one or more embodiments of the present invention. Computing device 100 is configured to run productive congestion application 150 that resides in a memory 116. In some embodiments, computing device 100 is also configured to run space design application 118. It is noted that the computing device described herein is illustrative and that any other technically feasible configurations fall within the scope of the present invention.

As shown, computing device 100 includes, without limitation, an interconnect (bus) 112 that connects one or more processing units 102, an input/output (I/O) device interface 104 coupled to one or more input/output (I/O) devices 108, memory 116, a storage 114, and a network interface 106. Processing unit(s) 102 may be any suitable processor implemented as a central processing unit (CPU), a graphics processing unit (GPU), an application-specific integrated circuit (ASIC), a field programmable gate array (FPGA), any other type of processing unit, or a combination of different processing units, such as a CPU configured to operate in conjunction with a GPU. In general, processing unit(s) 102 may be any technically feasible hardware unit capable of processing data and/or executing software applications, including positive congestion application 150. Further, in the context of this disclosure, the computing elements shown in computing device 100 may correspond to a physical computing system (e.g., a system in a data center) or may be a virtual computing instance executing within a computing cloud.

I/O devices 108 may include devices capable of providing input, such as a keyboard, a mouse, a touch-sensitive screen, and so forth, as well as devices capable of providing output, such as a display device. Additionally, I/O devices 108 may include devices capable of both receiving input and providing output, such as a touchscreen, a universal serial bus (USB) port, and so forth. I/O devices 108 may be configured to receive various types of input from an end-user (e.g., a designer) of computing device 100, and to also provide various types of output to the end-user of computing device 100, such as displayed digital images or digital videos or text. In some embodiments, one or more of I/O devices 108 are configured to couple computing device 100 to a network 110.

Network 110 may be any technically feasible type of communications network that allows data to be exchanged between computing device 100 and external entities or devices, such as a web server or another networked computing device. For example, network 110 may include a wide area network (WAN), a local area network (LAN), a wireless (WiFi) network, and/or the Internet, among others.

Storage 114 may include non-volatile storage for applications and data, and may include fixed or removable disk drives, flash memory devices, and CD-ROM, DVD-ROM, Blu-Ray, HD-DVD, or other magnetic, optical, or solid state storage devices. Space design application 118 and productive congestion application 150 may be stored in storage 114 and loaded into memory 116 when executed. Additionally, one or more architectural space designs (not shown) and corresponding data may be stored in storage 114.

Memory 116 may include a random access memory (RAM) module, a flash memory unit, or any other type of memory unit or combination thereof. Processing unit(s) 102, I/O device interface 104, and network interface 106 are configured to read data from and write data to memory 116. Memory 116 includes various software programs that can be executed by processor(s) 102 and application data associated with said software programs, including space design application 118 and productive congestion application 150.

Space design application 118 is a software application that, when executed by processing unit(s) 102, may provide to end-users of computing device 100 features associated with the design of architectural spaces and layouts in such spaces. In some embodiments, space design application 118 may include a graphical user interface that allows an end-user to input one or more designs for a space design project and to specify any number of design constraints and objectives, and to make changes to the designs and to the constraints and objectives. Space design application 118 may also provide visual feedback to the end-user (e.g., displaying a design from various angles and views, updating the displayed design in accordance with changes made by the end-user). Space design application 118 may perform various analyses on a design, and display results of the analysis in the graphical user interface (e.g., a visualization of the analysis results) as well.

In some embodiments, space design application 118 is configured to provide a feature to create designs according to a generative design method. When executed by processor(s) 102, space design application 118 may automatically generate different candidate designs based on a base design input by an end-user and in accordance with constraints specified by the end-user. Space design application 118 evaluates the candidate designs, in order to discover designs that achieve specified design objectives (e.g., optimization of one or more parameters, meeting certain requirements). For example, an end-user may input a base design (e.g., the outer boundary of a space, ingress(es), and egress (es)) and specify certain constraints and objectives. Space design application 118 generates candidate designs from the base design in accordance with the specified constraints (e.g., designs that includes different layouts for the space), and evaluates the candidate designs with respect to the specified objectives. Space design application 118 may identify one or more of the candidate designs that achieve the objectives, and may present these identified designs to the end-user. The number of candidate designs that space design application 118 may generate and evaluate may be any number (e.g., thousands or even more).

In some embodiments, the objectives to be achieved may include optimization of certain characteristics or properties. For example, a space may be required to have as much sunlight as feasible, to have at least a certain level of views to the outside, and so on. In some embodiments, a characteristic or property may be expressed as a value that represents a metric for the characteristic or property, and a definition of what values of the metric are desirable (e.g., higher the value the better, lower the value the better, values within a defined range are desirable, values outside of a defined range are desirable, the value must be above or below a threshold, etc.). A metric value for a characteristic or property may be determined for each candidate design. The values are compared amongst the candidate designs and to the desirable value definition in order to identify the candidate design(s) that optimize the metric for the characteristic or property. The end-user may specify multiple characteristics or properties to be optimized, and space design application 118 may evaluate candidate designs to optimize the respective metrics corresponding to the characteristics or properties.

A property that may be specified for optimization in a design is productive congestion. Productive congestion reflects congestion that has positive effects, as opposed to congestion that has negative effects (e.g., congestion that causes unsafe bottlenecks). In operation, productive congestion application 150 determines a productive congestion metric value for the design. In some embodiments, the metric value is determined by generating space analysis graph for the design, evaluating the space analysis graph, and determining the value based on the evaluation. The determined productive congestion metric value may be provided to space design application 118 (e.g., for comparison with the productive congestion metric values of other designs). In some embodiments, productive congestion application 150 is a sub-application or sub-module of space design application 118 (e.g., a component application or module, an add-on, a plug-in).

Figure 2:
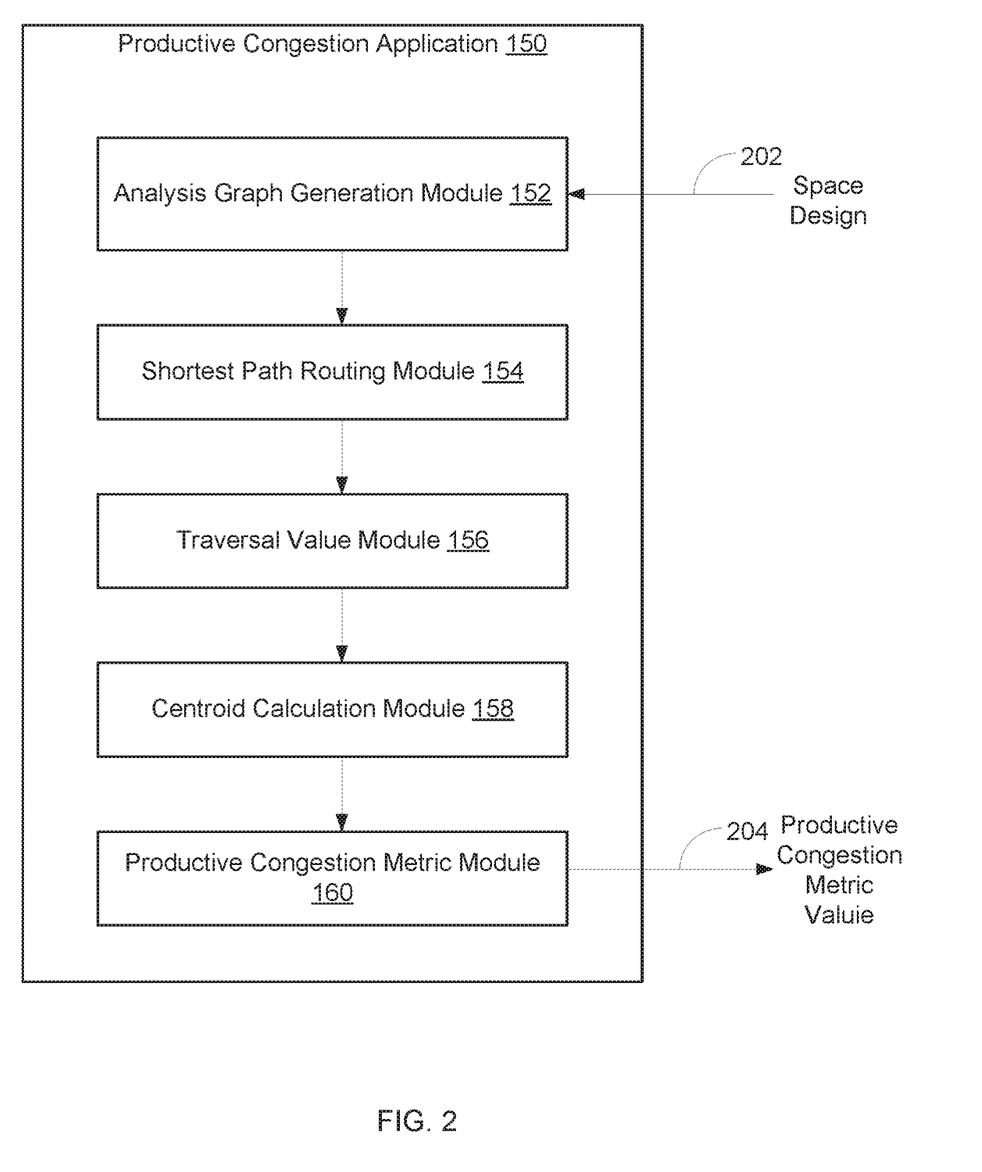
FIG. 2 is a block diagram of a productive congestion application, according to various embodiments of the present invention.

FIG. 2 is a block diagram of productive congestion application 150, according to various embodiments of the present invention. As shown, productive congestion application 150 includes analysis graph generation module 152, shortest path routing module 154, traversal value module 156, centroid calculation module 158, and productive congestion metric module 160. Productive congestion application 150 receives as input a design 202 for an architectural space. Design 202 corresponds to a two-dimensional, top-down view of the architectural space. Design 202 may be, for example, a candidate design generated by space design application 118. As another example, design 202 may be a complete design input by an end-user within space design application 118.

After productive congestion application 150 receives design 202, analysis graph generation module 152 generates a space analysis graph for design 202. The space analysis graph simulates possible traversal routes within the space of design 202. The source and sink points are incorporated into the space analysis graph. The space analysis graph accounts for the boundaries in design 202.

Shortest path routing module 154 determines a shortest path from each source point to each sink point within the space analysis graph. Traversal value module 156 determines a traversal value for each node in the space analysis graph. The traversal value for a node is related to the number of times the node is traversed by the source-point to sink-point paths determined by shortest path routing module 154. In some embodiments, traversal value module 156 also dissipates, for a given node, the traversal value of the node among itself and its adjacent nodes, and determines the new traversal value for the node. In some embodiments, the dissipation may be performed by another module (not shown) in productive congestion application 150. The shortest path routing module 154 may determine shortest paths using any suitable technique or algorithm (e.g., Dijkstra's algorithm).

Centroid calculation module 158 calculates a centroid of the nodes of the space analysis graph, and incorporates the centroid into the space analysis graph. Shortest path routing module 154 determines a shortest path from each node in the graph to the centroid using any suitable technique or algorithm (e.g., Dijkstra's algorithm). Productive congestion metric module 160 determines a productive congestion metric value 204 for design 202 by summing weighted lengths of the node-to-centroid paths. The value 204 may be transmitted to space design application 118. Space design application 118 may compare values 204 of multiple designs 202 to identify one or more designs that optimize productive congestion (e.g., have the highest value 204).

Further details regarding the process, by productive congestion application 150, for determining productive congestion metric value 204 for design 202 will now be described below, with reference to FIGS. 3A-5B.

Figure 3A:
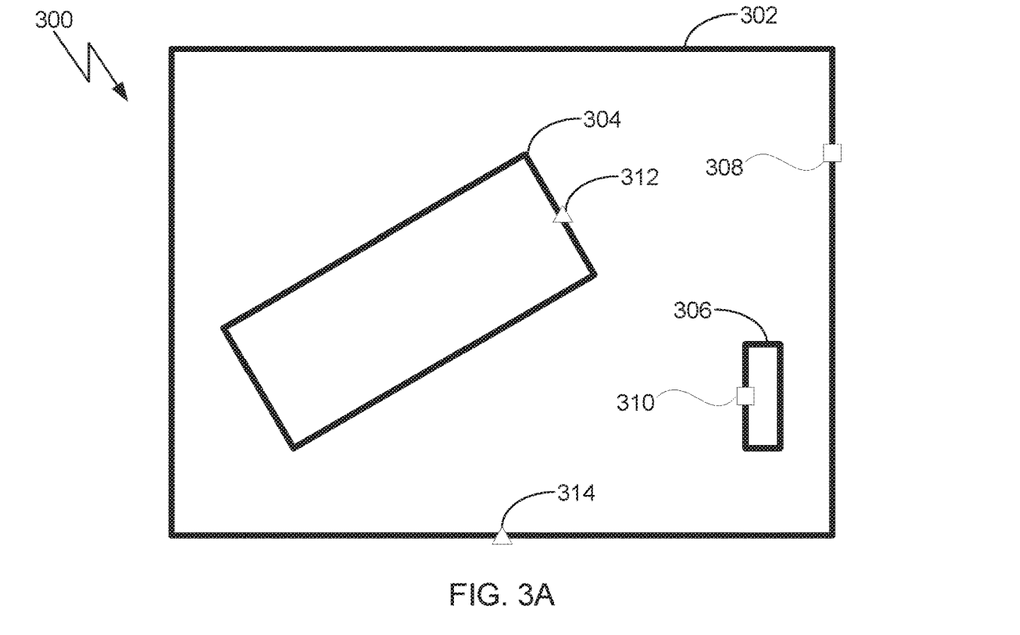
FIG. 3A illustrates an exemplary representation of a design for an architectural space, according to various embodiments of the present invention.

FIG. 3A illustrates an exemplary representation of a design 300 for an architectural space, according to various embodiments of the present invention. Design 300 illustrates a design that may be received as design 202 by productive congestion module 150.

Design 300 includes multiple elements. In some embodiments, design 300 includes specifications of an outer boundary, one or more inner boundaries within the outer boundary, one or more movement source points, and one or more movement sink points. The outer boundary corresponds to the outer limits or enclosure of the space being designed (e.g., the walls of a convention hall space, the sides of the area of the space being designed). In some embodiments, the outer boundary is represented in design 300 by a closed polyline (e.g., a simple polygon). As shown in FIG. 3A, design 300 includes outer boundary 302, shown as a closed polyline.

Inner boundaries may include any boundaries that are located in the space within the outer boundary. The inner boundaries represent obstacles within the space that occupants are not intended to pass through. Examples of inner boundaries may include, without limitation, walls within the space (e.g., walls of interior rooms, walls of an interior elevator shaft, walls of interior offices), desks or banks of desks, cubicles or banks of cubicles, exhibition booths or stages, support structures (e.g., pillars), barriers, fencing, aesthetic features (e.g., water fountain, vegetation area), and so on. An inner boundary may be represented in design 300, depending on the particular boundary, by a closed or a non-closed polyline. As shown, design 300 includes inner boundaries 304 and 306, both of which are shown as closed polylines.

In some embodiments, if an outer or inner boundary within design 300 has any curving in the top-down view (e.g., a semi-circular wall, an elliptical meeting room), space design application 118 or productive congestion application 150 may substitute the curved boundary with a polyline that approximates the curved boundary (e.g., a best-fit polyline) for purposes of determining the productive congestion metric value, without necessarily modifying the design 300 itself.

A movement source point (hereinafter "source point") represents a source of occupant movement or locations from which occupants are coming. Examples of source points include, without limitation, entrance(s) or ingresses into the space, employee desks, and so on. Source points may be specified by the end-user via space design application 118.

In some embodiments, a source point may be included for each expected occupant of the space (e.g., a source point for each desk in an office space). These source points for each expected occupant may be in addition to any other defined source points (e.g., source points corresponding to entrances, etc.). As shown in FIG. 3A, design 300 includes source points 308 and 310.

A movement sink point (hereinafter "sink point") represents a sink of occupant movement or locations to which occupants are going. Examples of sink points include, without limitation, an entrance or ingress into a common area within the space, an entrance or ingress into a break room in an office, an entrance or ingress into an interior meeting room, shops or storefronts in a shopping mall, exhibition booths in an exhibition hall, exits or egresses from the space, and so on. Sink points may be specified by the end-user via space design application 118. As shown in FIG. 3A, design 300 includes sink points 312 and 314.

In some embodiments, a source point and a sink point may overlap (e.g., located at the substantially the same location). For example, a main doorway into the space may be both a source point of occupants entering and a sink point of occupants exiting. Overlapping source and sink points may be treated as distinct points that have the same coordinates.

Figure 3B:
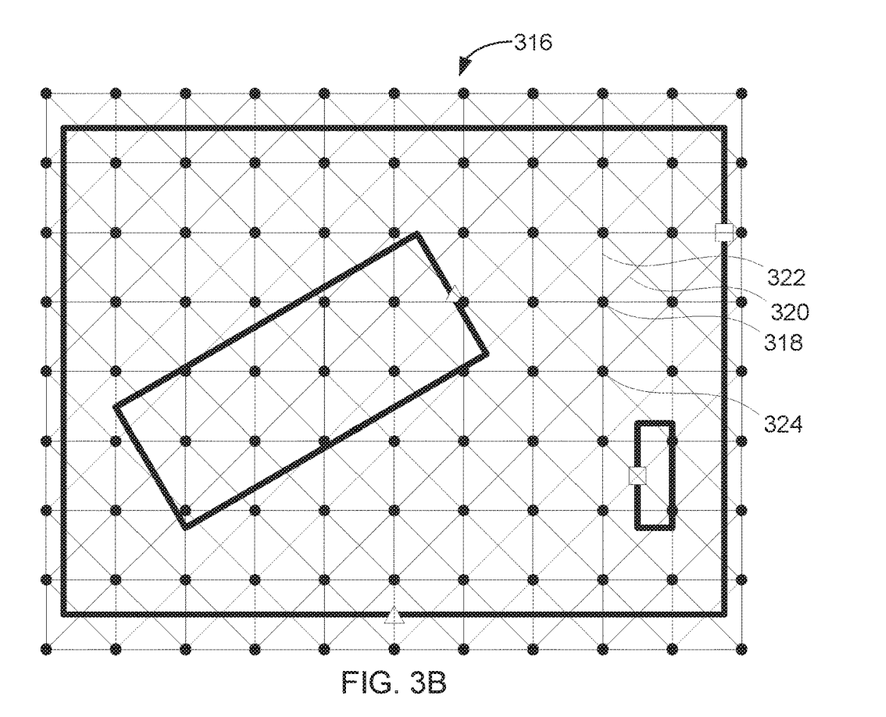
FIGS. 3B-3F illustrate the generation and evaluation of an exemplary space analysis graph for the architectural space design of FIG. 3A, according to various embodiments of the present invention.

FIGS. 3B-3F illustrate the generation and evaluation of an exemplary space analysis graph 316 for the architectural space design 300 of FIG. 3A, according to various embodiments of the present invention. FIG. 3B illustrates an initial space analysis graph 316 that may be generated by analysis graph generation module 152 for design 300. The initial space analysis graph 316 includes a grid of nodes, and edges connecting the nodes. Each node in the initial graph includes edges that connect the node to its immediate horizontally, vertically, and diagonally adjacent nodes. Thus, a node in the initial graph 316 may have up to eight adjacent nodes (one in each horizontal, vertical, and diagonal direction). For example, node 318 is connected to each of its eight horizontally, vertically, and diagonally adjacent nodes by respective edges, including edges 320 and 322 among others. As another example, node 324 is also is connected to each of its eight horizontally, vertically, and diagonally adjacent nodes by respective edges. Thus, initial graph 316 includes a grid of nodes, and multiple straight edges and diagonal edges.

In some embodiments, the grid of nodes is generated by generating a bounding box around design 300, and generating the grid of nodes in the bounding box. Nodes of the grid may be aligned with one or more sides of the bounding box. As shown in FIG. 3B, the sides of the grid of graph 316 correspond to the sides of a bounding box around design 300.

In some embodiments, the nodes in the grid of nodes are evenly spaced according to a defined grid resolution. The even spacing produces a regular sampling of the space in the design 300. The resolution specifies the horizontal and vertical spacing distance of the nodes in the grid. In some embodiments, the resolution is one meter; nodes are spaced horizontally and vertically at a distance that, according to the scale of design 300, corresponds to one meter in real life. In some embodiments, the one-meter resolution is a default resolution, and the resolution may be specified or changed by an end-user.

FIG. 3B shows graph 316 overlaid onto design 300. As shown in FIG. 3B, graph 316 covers the entirety of design 300. In some embodiments, design 300 is centered within the area covered by graph 316 when overlaying graph 316 over design 300. In some other embodiments, a side or outer corner of design 300 may be aligned with a side or corner, respectively, of the area covered by graph 316.

Figure 3C:
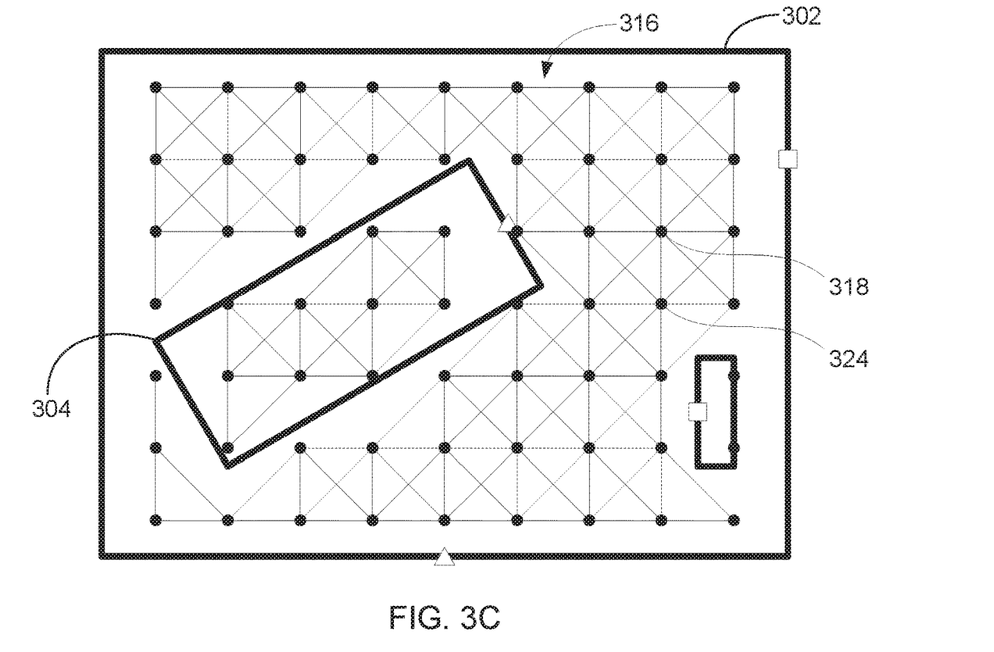

As shown in FIG. 3B, graph 316 includes edges that intersect the outer or inner boundaries of design 300. FIG. 3C illustrates graph 316 with the edges that intersect boundaries of design 300 removed from graph 316. Thus, for example, node 324 lost one connecting edge out of its eight connecting edges due to the removal of an edge that intersect one or more boundaries. On the other hand, node 318 did not lose any of its eight connecting edges because none of its connecting edges intersects a boundary. In FIG. 3C, nodes of graph 316 that are outside of outer boundary 302 have been removed from graph 316 as well. Thus, graph 316 in FIG. 3C is a disconnected graph, with a portion of graph 316 inside inner boundary 304. In some embodiments, the portion of graph 316 inside inner boundaries (e.g., the portion inside inner boundary 304) may be disregarded when evaluating the graph 316.

Figure 3D:
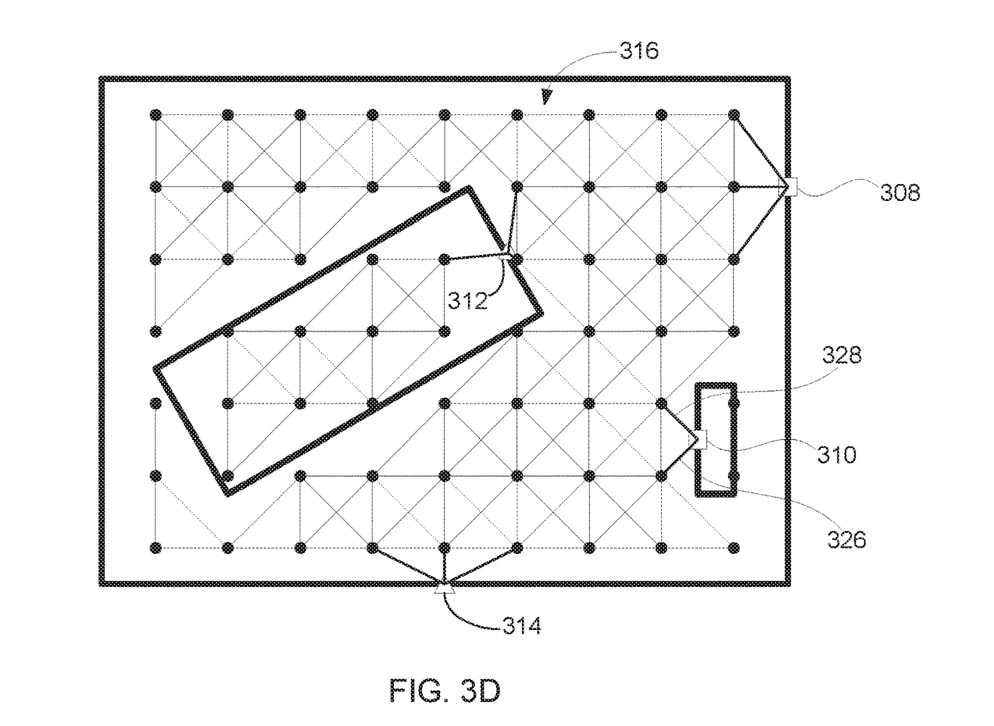

FIG. 3D illustrates graph 316 with source points 308, 310, and sink points 312, 314 incorporated into graph 316. Edges that connect a source point or sink point to nodes that are within the grid resolution distance are added to graph 316. Thus, for example, source point 310 is connected to two nodes in graph 316 by edges 326 and 328, respectively. In this manner, disconnected portions of graph 316 may be reconnected via source and sink points. For example, the portion of graph 316 within inner boundary 304 is reconnected to the other portions of graph 316 via sink point 312.

In some embodiments, one or more source point-sink point pairs may be weighted. Weights may be specified for such pairs to count certain traversal paths from source points to sink points more (e.g., the weight may be set to be greater than 1 because the path is considered important or highly trafficked) or less (e.g., the weight may be set to zero to disregard certain paths) in the evaluation of graph 316.

In some embodiments, if a source point (or sink point) is within a predefined distance tolerance from a node in graph 316, then the source point (or sink point) is considered to be at the same location as that node, and the source point (or sink point) may share the edges connected to that node. That is, edges connected to that node are also connected to the source point (or sink point) as well. One or more edges may still be generated to connect the source point (or sink point) to other nodes that are within the grid resolution distance.

Figure 3E:
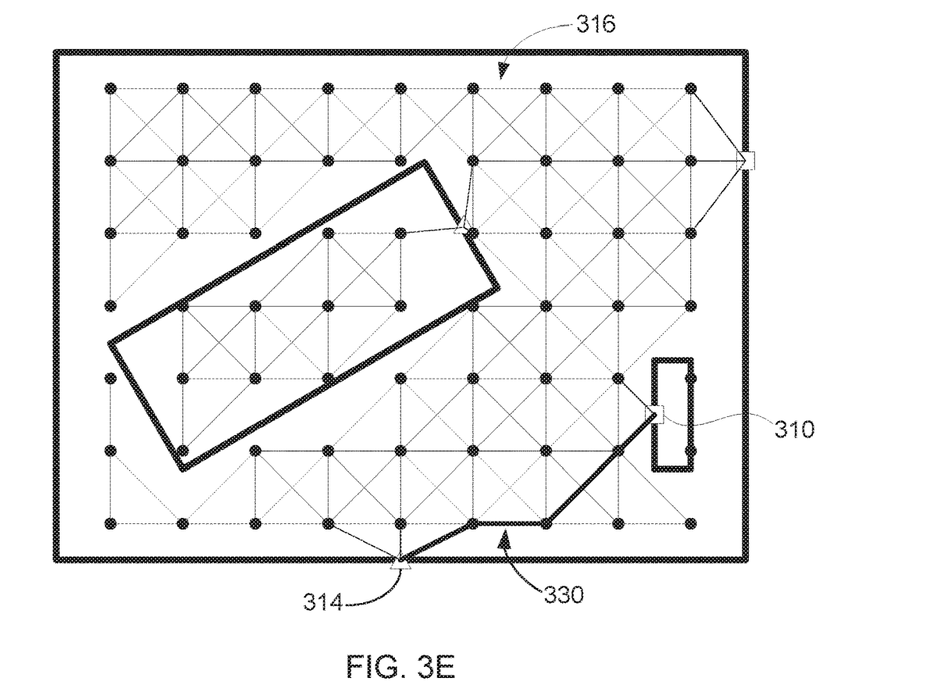

FIG. 3E illustrates path 330 that is the shortest path between source point 310 and sink point 314. Evaluation of graph 316 includes determining a shortest path from each source point to each sink point. Thus, in addition to path 330, shortest paths from source point 310 to sink point 312, from source point 308 to sink point 312, and from source point 308 to sink point 314, are also determined.

For each node on path 330 (not including the starting source point and the ending sink point of the path), a traversal value of the node is increased by one multiplied by a weight of the source point 310-sink point 314 pair, as a result of being traversed by the path 330. For example, if a node is included along four source-point to sink-point paths (i.e., the node is traversed by each of the four paths), and the weights of the source point-sink point pairs of the four paths are 1, 1, 5, and 0.3, then the traversal value for the node is $(1*1)+(1*1)+(1*5)+(1*0.3)=7.3$.

Figure 3F:
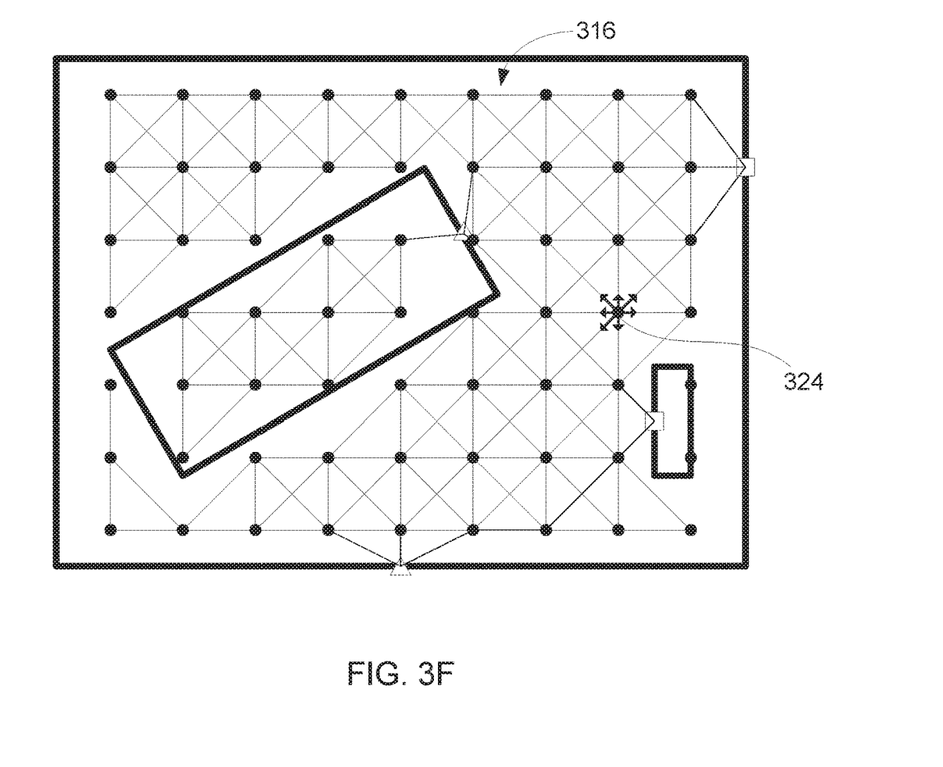

FIG. 3F illustrates directions of traversal value dissipation for node 324 in graph 316. In some embodiments, after shortest paths for each source point-sink point pair are determined and traversal values for each node in graph 316 are determined, traversal values for each node in graph 316 are dissipated among the node itself and its connected adjacent nodes, not including source and sink points. Thus, for example, the traversal value of node 324 is divided by 8 (node 324 itself and 7 connected adjacent nodes); each of node 324 and its 7 connected adjacent nodes receive an eighth of the traversal value of node 324. In some embodiments, dissipation of traversal values may be performed for graph 326 for multiple iterations (e.g., for a preset amount of iterations, until a sum of the deltas in traversal values before and after dissipation within an iteration is less than a predefined threshold).

Figure 4A:
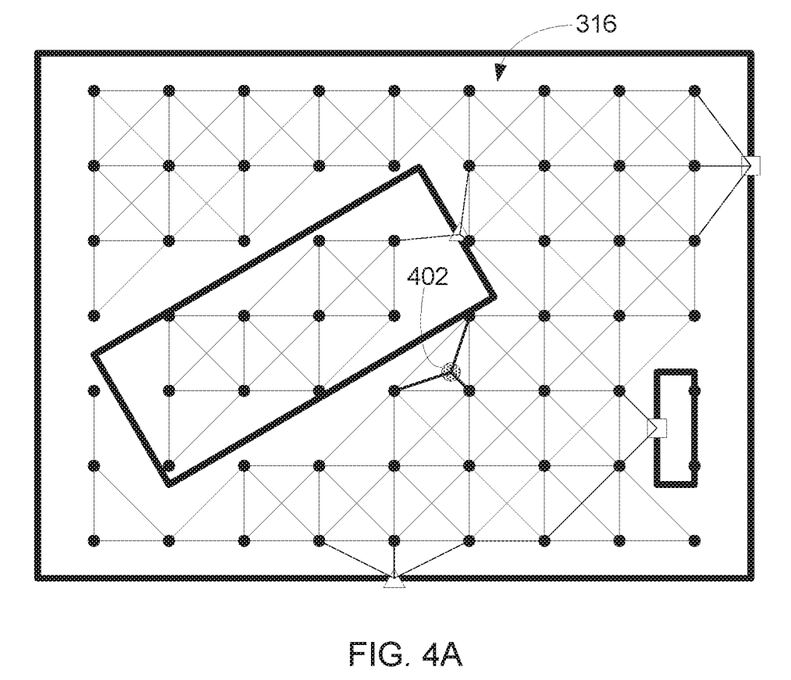
FIG. 4A illustrates the space analysis graph of FIGS. 3B-3F with a calculated centroid added to the graph, according to various embodiments of the present invention.

FIG. 4A illustrates the space analysis graph of FIGS. 3B-3F with a calculated centroid added to the graph, according to various embodiments of the present invention. After the dissipation of traversal values in graph 316 is completed, a centroid 402 of the nodes in graph 316 is calculated and incorporated into graph 316. In some embodiments, the (x, y) coordinates of the centroid is the weighted mean of the (x, y) coordinates of the nodes of graph 316, not including the source and sink points, that have non-zero traversal values. The (x, y) coordinates of each node is weighted by the traversal value of the node, and the weighted coordinates are used to calculate the centroid.

Figure 4B:
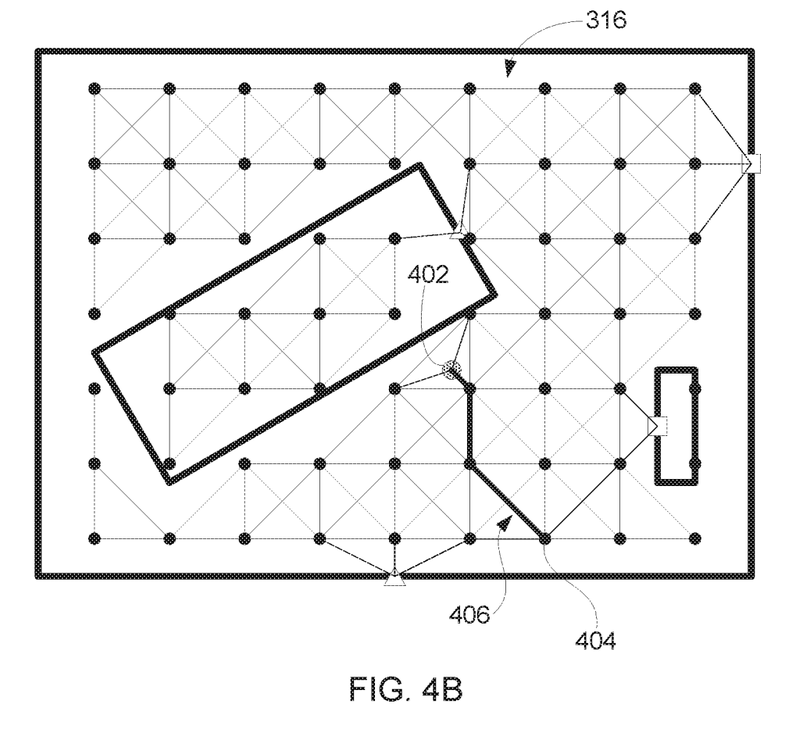
FIG. 4B illustrates a route from a node in the space analysis graph of FIG. 4A to the calculated centroid in the graph, according to various embodiments of the present invention.

FIG. 4B illustrates a route from a node in the space analysis graph of FIG. 4A to the calculated centroid in the graph, according to various embodiments of the present invention. FIG. 4B illustrates path 406 that is the shortest path from node 404 of graph 316 to centroid 402. Evaluation of graph 316 includes determining a shortest path from node of graph 316 that has a non-zero traversal value to centroid 402. To determine a productive congestion metric value for design 300, the lengths of the node-to-centroid paths, weighted by the traversal value of the node, are summed, where the length of the path is the number of edges on the path from the node to the centroid.

Figure 5A:
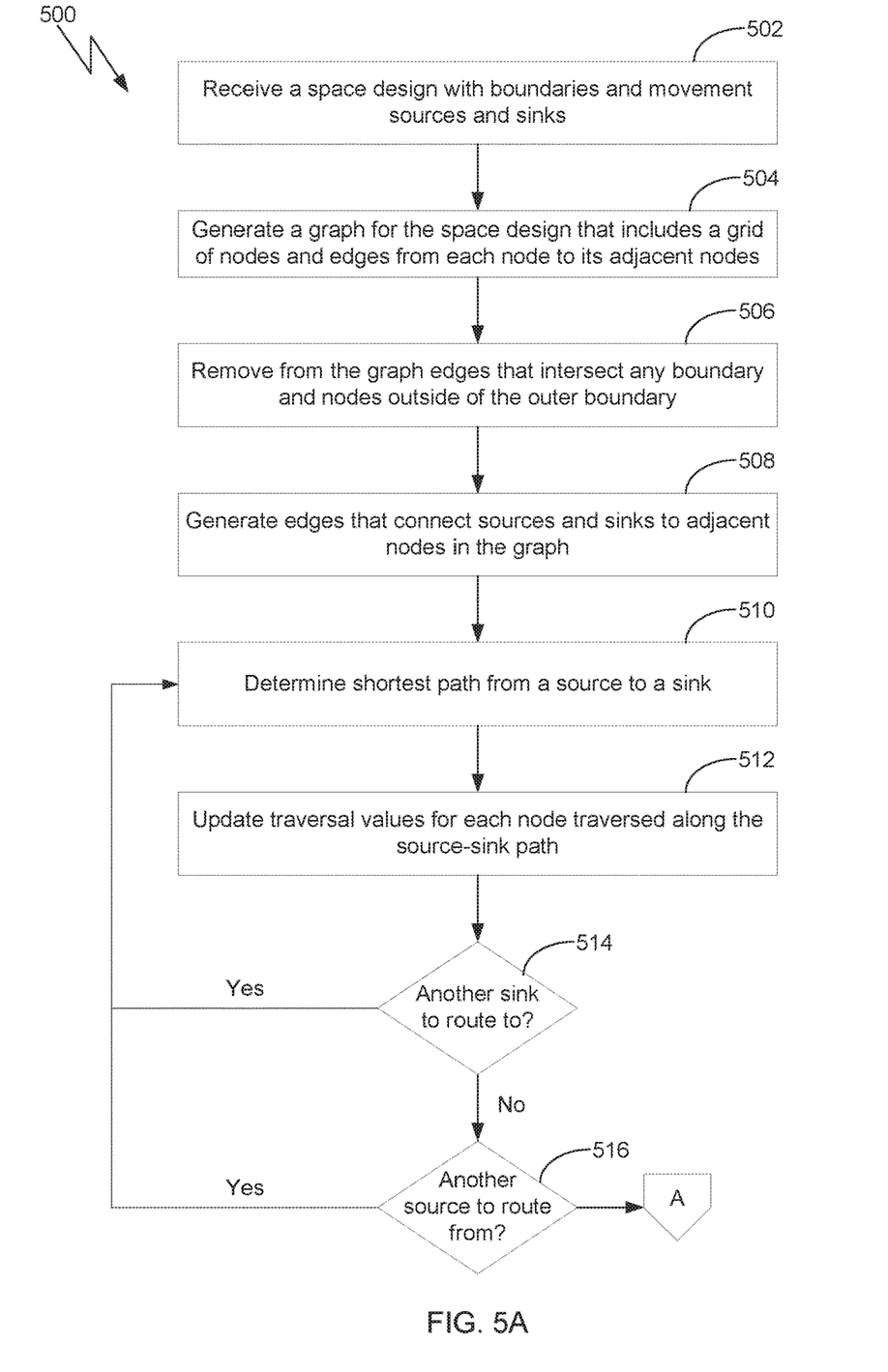
FIGS. 5A-5B set forth a flowchart of method steps for determining a productive congestion metric for an architectural space design, according to various embodiments of the present invention.
Figure 5B:
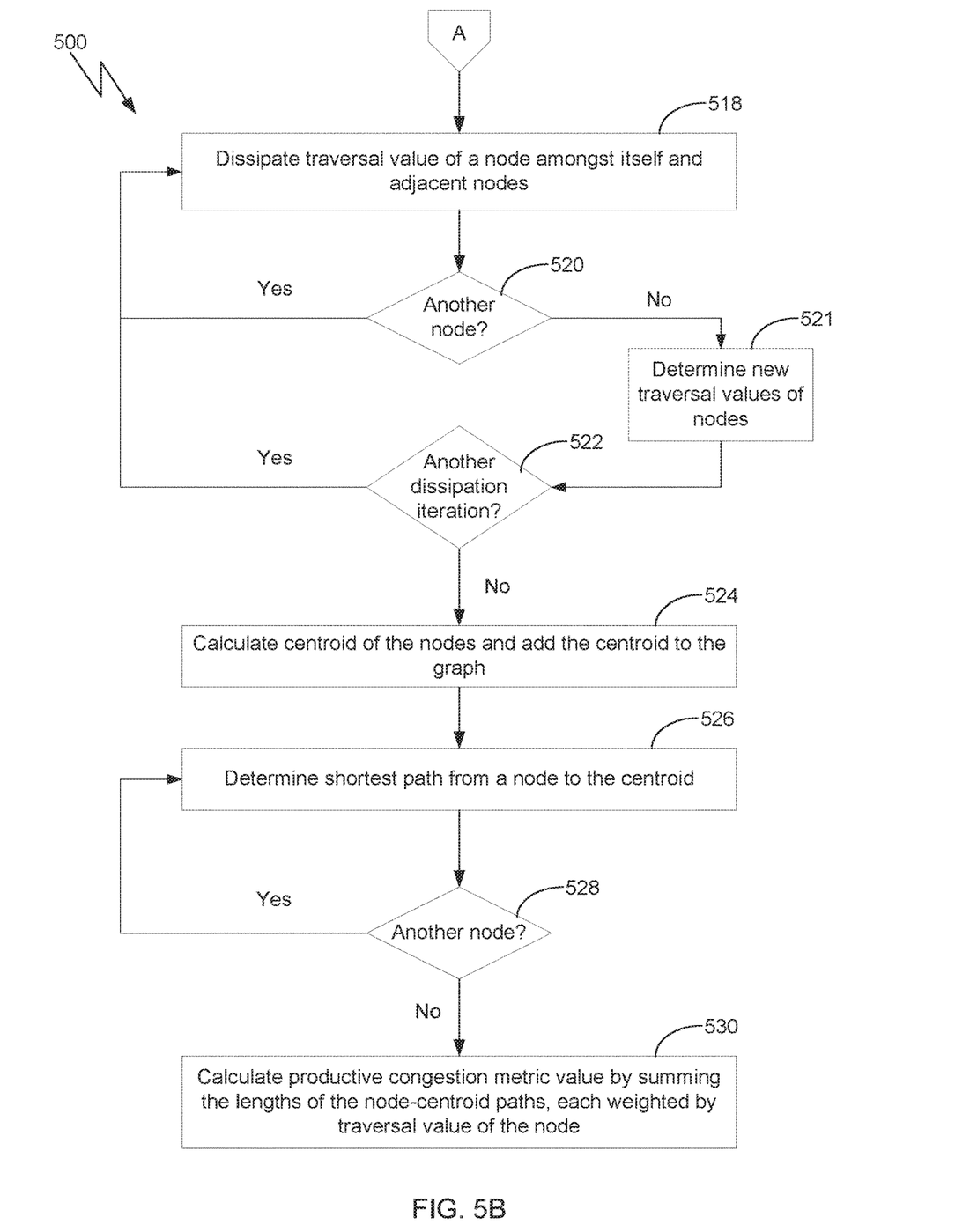

FIGS. 5A-5B set forth a flowchart 500 of method steps for determining a productive congestion metric for an architectural space design, according to various embodiments of the present invention. Although the method steps are described in conjunction with the systems of FIGS. 1-4B, persons skilled in the art will understand that any system configured to perform the method steps, in any order, is within the scope of the present invention.

As shown, a method 500 begins at step 502, where productive congestion application 150 receives a space design with boundaries and movement sources and sinks. Productive congestion application 150 receives an input design 202 from space design application 118. For example, productive congestion application 150 may receive design 300 (FIG. 3A) as input. Design 300 includes specifications of outer boundaries, inner boundaries, source points, and sink points. In some embodiments, design 300 also includes weights for one or more source point-sink point pairs. If a weight is not specified for a source point-sink point pair, the weight of the pair defaults to 1. Accordingly, if no weights are defined at all for any pair, then the weight of all of the pairs is 1. The weights of source point-sink point pairs may specified in any suitable manner, such as a matrix.

In some embodiments, if a boundary in the input design includes a rounded portion, productive congestion application 150 may substitute the rounded portion (e.g., at pre-processing) with a polyline that approximates the rounded portion (e.g., a best-fit polyline).

At step 504, analysis graph generation module 152 generates a grid of nodes and edges connecting each node to its adjacent nodes. For example, as shown in FIG. 3B, graph 316 with a grid of nodes and edges is generated by analysis graph generation module 152 and overlaid over design 300. The grid of nodes may be evenly spaced at a defined grid resolution (e.g., one meter).

At step 506, analysis graph generation module 152 removes from the graph edges that intersect any boundary and nodes outside of the outer boundary. For example, as shown in FIG. 3C, edges in graph 316 that intersect any of the outer or inner boundaries are removed. Edges that intersect a boundary may be determined using any suitable technique or algorithm. Nodes that are located outside of the outer boundary 302 are removed as well.

At step 508, analysis graph generation module 152 generates one or more edges that connect sources and sinks to neighboring nodes in the graph. Source points and sink points are incorporated into the graph by connecting these points to their adjacent nodes within the grid resolution distance with additional edges. An edge to connect a source point or sink point to an adjacent node may be generated if the edge does not intersect a boundary. For example, as shown in FIG. 3D, edges 326 and 328 are generated to connect source point 310 to its adjacent nodes.

At step 510, shortest path routing module 154 determines a shortest path in the graph from a source point to a sink point. For example, as shown in FIG. 3E, a shortest path 330 in graph 316 from source point 310 to sink point 314 is determined. For this shortest path determination at step 510, the start point is a source point, and the ending point is a sink point.

At step 512, traversal value module 156 updates traversal values for each node traversed by the shortest path determined in step 510. Thus, for example, in FIG. 3E, each node on path 330 has its traversal value increased by one multiplied by the weight of the source point 310-sink point 314 pair. Prior to step 510, each node in the graph (e.g., graph 316) starts with a traversal value of 0.

A shortest path is determined for each source point-sink point pair. Thus, at step 514, shortest path routing module 154 determines if there is another sink point to route to for a given source point. If shortest path routing module 154 determines that there is another sink point to route to for a given source point, then method 500 returns to step 510, where shortest path routing module 154 determines a shortest path from the given source point to the another sink point. If shortest path routing module 154 determines that there is no more sink points to route to for a given source point, then method 500 proceeds to step 516.

At step 516, shortest path routing module 154 determines if there is another source point to route from (i.e., for which shortest paths to sink points need to be determined). If shortest path routing module 154 determines that there is another source point to route from, then method 500 returns to step 510, where shortest path routing module 154 determines a shortest path from the another source point to a sink point. If shortest path routing module 154 determines that there is no more source points to route from, then method 500 proceeds to step 518, shown in FIG. 5B.

At step 518, traversal value module 156 dissipates the traversal value of a node in the graph amongst the node and its adjacent nodes (not including source points and sink points). For example, in FIG. 3F, the traversal value of node 324 is divided by 8 (the node itself plus 7 adjacent nodes). Thus, if the traversal value for node 324 is 80, then each of node 324 and the adjacent nodes of node 324 gets 10. The 10 for each of these nodes may be added to other dissipated traversal values received from other nodes. In some embodiments, the dissipated traversal values are not added to the original pre-dissipation traversal value (e.g., a node, before its original traversal value is dissipated in the iteration, that receives dissipated values from other nodes does not have its original traversal value increased by the received dissipated values). Thus, node traversal values are tracked and stored for each node. In some embodiments, edge traversals (e.g., how many times is an edge included in the paths) may be tracked and stored as well for visualization purposes.

Traversal values are dissipated for each node, in each of multiple dissipation iterations. Thus, at step 520, traversal value module 156 determines if there is another node in the graph for which dissipation is to be performed in the current iteration. If traversal value module 156 determines that there is another node for which dissipation is to be performed in the current iteration, then method 500 returns to step 518, where traversal value module 156 dissipates the traversal value for the another node. If traversal value module 156 determines that is no more nodes for which dissipation is to be performed in the current iteration, then method 500 proceeds to step 522.

At step 521, traversal value module 156 determines the new traversal values for each node in the graph. In some embodiments, the new traversal value for a node is determined by summing the dissipated traversal values the node has received from other nodes and from the dissipation of its own original traversal value.

At step 522, traversal value module 156 determines if there is another iteration of dissipations to be performed. If traversal value module 156 determines that there is another iteration of dissipation to be performed, then method 500 returns to step 518, where traversal value module 156 dissipates the traversal value of a node in a new iteration. If traversal value module 156 determines that there are no more iterations of dissipations to perform, then method 500 proceeds to step 524.

In some embodiments, the number of iterations is predefined (e.g., 2-5 iterations). Thus, traversal value module 156 may track the current iteration and compare to the predefined number of iterations. In some other embodiments, a criterion for stopping the iterations is that the dissipations converge. In some embodiments, a heuristic for convergence of the dissipations is that a sum or a mean of the deltas in traversal values of the nodes at the end of an iteration is less than a predefined threshold. The delta of a traversal value for a node is the difference in the traversal value at the beginning of the iteration (before the dissipations for the iteration) and at the end of the iteration (after the dissipations for the iteration).

At step 524, centroid calculation module 158 calculates a centroid of the nodes of the graph, and incorporates the centroid into the graph. For example, as shown in FIG. 4A, centroid 402 is calculated and incorporated into graph 316. In some embodiments, the centroid is calculated as a weighted mean of the (x, y) coordinates of the nodes of the graph with non-zero traversal values. The (x, y) coordinates for a node in the centroid calculation is weighted (multiplied) by the traversal value of the node.

At step 526, shortest path routing module 154 determines a shortest path in the graph from a node in the graph (not including source points and sink points) to the centroid. For example, as shown in FIG. 3B, a shortest path 406 in graph 316 from node 404 to centroid 402 is determined. For this shortest path determination at step 526, the start point is a node in the graph (not including the source points, sink points, and the centroid), and the ending point is the centroid.

A shortest path is determined for each node-centroid pair. Thus, at step 528, shortest path routing module 154 determines if there is another node from which to route to the centroid. If shortest path routing module 154 determines that there is another node from which to route to the centroid, then method 500 returns to step 526, where shortest path routing module 154 determines a shortest path from the another node to the centroid. If shortest path routing module 154 determines that there is no more nodes from which to route to the centroid, then method 500 proceeds to step 530.

At step 530, productive congestion metric module 160 calculates a productive congestion metric value 204 for the design by summing the weighted lengths of the node-centroid paths. The length of a node-centroid path is the number of edges in the path. The length is weighted by the traversal value of the starting node of the path. The result of the calculation is a single value that represents the productive congestion metric of the design, in which the higher the value the better the productive congestion (i.e., higher values are more desirable). The value may be transmitted to space design application 118. Space design application 118 may use the value 204 within a generative design process (e.g., to compare respective values 204 for multiple designs to identify one or more designs with optimal productive congestion while also achieving other defined design objectives).

In some embodiments, space design application 118 may present to end-users (e.g., in a user interface of space design application 118) visualizations of the graph evaluation performed by productive congestion application 150, and the productive congestion metric value. For example, space design application 118 may display the productive congestion metric value to the end-user. Space design application 118 may also display a grid of nodes of the space analysis graph over the design, where the nodes are displayed with varying sizes based on traversal value (e.g., the larger the traversal value, the larger the size of the displayed node). Along with the grid of nodes, space design application 118 may display certain source-point to sink-point paths, with path thickness varying based on weights of the source point-sink point pairs. Space design application 118 may also display heat maps of traversal values over the design. In this manner, the space analysis graph and the evaluation thereof, and the productive congestion metric value, may be used in manual design processes as well. For example, a designer may manually create or change a design, and feedback regarding the productive congestion of the created or changed design (e.g., productive congestion metric value, heat maps, etc.) may be communicated to the user quickly.

In sum, the disclosed techniques may be used to measure the productive congestion of an architectural space design. In operation, a productive congestion application generates a space analysis graph for a space design that includes defined boundaries and sources and sinks of occupant movement. Traversals from sources to sinks are evaluated based on the analysis graph, and values are determined for the nodes of the analysis graph based on the evaluated traversals. A centroid is then added to the analysis graph, and routes from nodes in the graph to the centroid are evaluated. A productive congestion metric is calculated for the design based on the routes to the centroid.

An advantage and technological improvement of the disclosed techniques is that the productive congestion of a space is measured in a computationally inexpensive manner relative to conventional techniques. Another advantage and technological improvement of the disclosed techniques is that the productive congestion of a space is quantified into a single numerical metric. These advantages facilitate incorporation of the disclosed techniques into generative design methods, in order that the productive congestion may be optimized amongst the many design options evaluated under those generative design methods.

1. In some embodiments, a method for evaluating productive congestion within an architectural space design comprises generating a space analysis graph for the architectural space design; determining a traversal value for at least a first node of a plurality of nodes included in the space analysis graph; determining a centroid of the plurality of nodes; determining a path within the space analysis graph from at least the first node to the centroid; and determining a productive congestion metric based on at least the path from the first node to the centroid and the traversal value of the first node.

2. The method of clause 1, wherein the architectural space design comprises one or more boundaries, one or more movement source points, and one or more movement sink points.

3. The method of clauses 1 or 2, wherein a boundary included in the one or more boundaries comprises a polyline.

4. The method of any of clauses 1-3, wherein generating the space analysis graph comprises: generating a grid of nodes and a first set of edges, wherein each edge included in the first set of edges connects a node in the grid of nodes to an adjacent node in the grid of nodes; overlaying the grid of nodes and the first set of edges onto the architectural space design; removing one or more edges included in the first set of edges that intersect one or more boundaries included in the architectural space design; generating a second set of edges, wherein each edge included in the second set of edges connects a movement source point included in the architectural space design to a node in the grid of nodes adjacent to the movement source point; and generating a third set of edges, wherein each edge included in the third set of edges connects a movement sink point included in the architectural space design to a node in the grid of nodes adjacent to the movement sink point.

5. The method of any of clauses 1-4, wherein the nodes in the grid of nodes are evenly spaced.

6. The method of any of clauses 1-5, wherein determining the traversal value for the first node comprises: determining, for a first movement source point included in the space analysis graph, a shortest path in the space analysis graph from the first movement source point to a first movement sink point included in the space analysis graph; determining that the first node is located along the shortest path; and in response, increasing the traversal value of the first node.

7. The method of any of clauses 1-6, wherein determining the traversal value for the first node further comprises dividing the traversal value of the first node between the first node and one or more adjacent nodes of the first node.

8. The method of any of clauses 1-7, wherein determining the path within the space analysis graph from the first node to the centroid comprises determining a shortest path from the first node to the centroid.

9. The method of any of clauses 1-8, wherein the productive congestion metric is based on the length of the path from the first node to the centroid.

10. The method of any of clauses 1-9, wherein the length of the path from the first node to the centroid is weighted by the traversal value of the first node.

11. In some embodiments, a non-transitory computer readable medium stores instructions that, when executed by a processor, cause the processor to perform the steps of generating a space analysis graph for the architectural space design; determining a traversal value for at least a first node of a plurality of nodes included in the space analysis graph; determining a centroid of the plurality of nodes; determining a path within the space analysis graph from at least the first node to the centroid; and determining a productive congestion metric based on at least the path from the first node to the centroid and the traversal value of the first node.

12. The computer storage medium of clause 11, wherein generating the space analysis graph comprises generating a grid of nodes and a first set of edges, wherein each edge included in the first set of edges connects a node in the grid of nodes to an adjacent node in the grid of nodes; overlaying the grid of nodes and the first set of edges onto the architectural space design; removing one or more edges included in the first set of edges that intersect one or more boundaries included in the architectural space design; generating a second set of edges, wherein each edge included in the second set of edges connects a movement source point included in the architectural space design to a node in the grid of nodes adjacent to the movement source point; and generating a third set of edges, wherein each edge included in the third set of edges connects a movement sink point included in the architectural space design to a node in the grid of nodes adjacent to the movement sink point.

13. The computer storage medium of clauses 11 or 12, wherein the nodes in the grid of nodes are spaced in accordance with a defined grid resolution.

14. The computer storage medium of any of clauses 11-13, wherein determining the traversal value for the first node comprises determining, for a first movement source point included in the space analysis graph, a shortest path in the space analysis graph from the first movement source point to a first movement sink point included in the space analysis graph; determining that the first node is located along the shortest path; and in response, increasing the traversal value of the first node.

15. The computer readable medium of any of clauses 11-14, wherein the increase of the traversal value of the first node is weighted by a weight associated with a pairing of the first movement source point and the first movement sink point.

16. The computer readable medium of any of clauses 11-15, wherein determining the centroid of the plurality of nodes comprises determining the centroid based on at least coordinates of the first node, wherein the coordinates of the first node are weighted by the traversal value of the first node.

17. The computer readable medium of any of clauses 11-16, wherein determining the path within the space analysis graph from the first node to the centroid comprises determining a shortest path from the first node to the centroid.

18. The computer readable medium of any of clauses 11-17, wherein the productive congestion metric is based on the length of the path from the first node to the centroid.

19. The computer readable medium of any of clauses 11-18, wherein the length of the path from the first node to the centroid is weighted by the traversal value of the first node.

20. In some embodiments, a system comprises a memory that stores instructions, and a processor that is coupled to the memory and, when executing the instructions, is configured to generate a space analysis graph for the architectural space design; determine a traversal value for at least a first node of a plurality of nodes included in the space analysis graph; determine a centroid of the plurality of nodes; determine a path within the space analysis graph from at least the first node to the centroid; and determine a productive congestion metric based on at least the path from the first node to the centroid and the traversal value of the first node.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method for evaluating productive congestion within an architectural space design, comprising:
    generating a space analysis graph for the architectural space design;
    determining a traversal value for at least a first node of a plurality of nodes included in the space analysis graph;
    determining a centroid of a node group comprising the plurality of nodes;
    determining a path within the space analysis graph from at least the first node to the centroid;
    determining a productive congestion metric for the architectural space design based on at least the path from the first node to the centroid and the traversal value of the first node; and
    comparing the productive congestion metric determined for the architectural space design with another productive congestion metric determined for another architectural space design to identify a preferred architectural space design.

2. The method of claim 1, wherein the architectural space design comprises one or more boundaries, one or more movement source points, and one or more movement sink points.

3. The method of claim 2, wherein a boundary included in the one or more boundaries comprises a polyline.

4. The method of claim 1, wherein generating the space analysis graph comprises:
    generating a grid of nodes and a first set of edges, wherein each edge included in the first set of edges connects a node in the grid of nodes to an adjacent node in the grid of nodes;
    overlaying the grid of nodes and the first set of edges onto the architectural space design;
    removing one or more edges included in the first set of edges that intersect one or more boundaries included in the architectural space design;
    generating a second set of edges, wherein each edge included in the second set of edges connects a movement source point included in the architectural space design to a node in the grid of nodes adjacent to the movement source point; and
    generating a third set of edges, wherein each edge included in the third set of edges connects a movement sink point included in the architectural space design to a node in the grid of nodes adjacent to the movement sink point.

5. The method of claim 4, wherein the nodes in the grid of nodes are evenly spaced.

6. The method of claim 1, wherein determining the traversal value for the first node comprises:
determining, for a first movement source point included in the space analysis graph, a shortest path in the space analysis graph from the first movement source point to a first movement sink point included in the space analysis graph;
determining that the first node is located along the shortest path; and
in response, increasing the traversal value of the first node.

7. The method of claim 6, wherein determining the traversal value for the first node further comprises dividing the traversal value of the first node between the first node and one or more adjacent nodes of the first node.

8. The method of claim 1, wherein determining the path within the space analysis graph from the first node to the centroid comprises determining a shortest path from the first node to the centroid.

9. The method of claim 1, wherein the productive congestion metric is based on the length of the path from the first node to the centroid.

10. The method of claim 9, wherein the length of the path from the first node to the centroid is weighted by the traversal value of the first node.

11. One or more non-transitory computer-readable media storing instructions that, when executed by one or more processors, cause the one or more processors to perform the steps of:
generating a space analysis graph for the architectural space design;
determining a traversal value for at least a first node of a plurality of nodes included in the space analysis graph;
determining a centroid of a node group comprising the plurality of nodes;
determining a path within the space analysis graph from at least the first node to the centroid;
determining a productive congestion metric for the architectural space design based on at least the path from the first node to the centroid and the traversal value of the first node; and
comparing the productive congestion metric determined for the architectural space design with another productive congestion metric determined for another architectural space design to identify a preferred architectural space design.

12. The one or more non-transitory computer-readable media of claim 11, wherein generating the space analysis graph comprises:
generating a grid of nodes and a first set of edges, wherein each edge included in the first set of edges connects a node in the grid of nodes to an adjacent node in the grid of nodes;
overlaying the grid of nodes and the first set of edges onto the architectural space design;
removing one or more edges included in the first set of edges that intersect one or more boundaries included in the architectural space design;
generating a second set of edges, wherein each edge included in the second set of edges connects a movement source point included in the architectural space design to a node in the grid of nodes adjacent to the movement source point; and
generating a third set of edges, wherein each edge included in the third set of edges connects a movement sink point included in the architectural space design to a node in the grid of nodes adjacent to the movement sink point.

13. The one or more non-transitory computer-readable media of claim 12, wherein the nodes in the grid of nodes are spaced in accordance with a defined grid resolution.

14. The one or more non-transitory computer-readable media of claim 11, wherein determining the traversal value for the first node comprises:
determining, for a first movement source point included in the space analysis graph, a shortest path in the space analysis graph from the first movement source point to a first movement sink point included in the space analysis graph;
determining that the first node is located along the shortest path; and
in response, increasing the traversal value of the first node.

15. The one or more non-transitory computer-readable media of claim 14, wherein the increase of the traversal value of the first node is weighted by a weight associated with a pairing of the first movement source point and the first movement sink point.

16. The one or more non-transitory computer-readable media of claim 11, wherein determining the centroid of the plurality of nodes comprises determining the centroid based on at least coordinates of the first node, wherein the coordinates of the first node are weighted by the traversal value of the first node.

17. The one or more non-transitory computer-readable media of claim 11, wherein determining the path within the space analysis graph from the first node to the centroid comprises determining a shortest path from the first node to the centroid.

18. The one or more non-transitory computer-readable media of claim 11, wherein the productive congestion metric is based on the length of the path from the first node to the centroid.

19. The one or more non-transitory computer-readable media of claim 18, wherein the length of the path from the first node to the centroid is weighted by the traversal value of the first node.

20. A system, comprising:
a memory that stores instructions, and
a processor that is coupled to the memory and, when executing the instructions, is configured to:
generate a space analysis graph for the architectural space design;
determine a traversal value for at least a first node of a plurality of nodes included in the space analysis graph;
determine a centroid of a node group comprising the plurality of nodes;
determine a path within the space analysis graph from at least the first node to the centroid;
determine a productive congestion metric for the architectural space design based on at least the path from the first node to the centroid and the traversal value of the first node; and
compare the productive congestion metric determined for the architectural space design with another productive congestion metric determined for another architectural space design to identify a preferred architectural space design.

\* \* \* \* \*